United States Patent
Lin et al.

(10) Patent No.: US 9,906,240 B2
(45) Date of Patent: Feb. 27, 2018

(54) ONE-SHOT DECODER FOR TWO-ERROR-CORRECTING BCH CODES

(71) Applicant: SK Hynix Memory Solutions Inc., San Jose, CA (US)

(72) Inventors: Yi-Min Lin, San Jose, CA (US); Aman Bhatia, San Jose, CA (US); Naveen Kumar, San Jose, CA (US); Chung-Li Wang, Fremont, CA (US); Lingqi Zeng, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/173,198

(22) Filed: Jun. 3, 2016

(65) Prior Publication Data
US 2016/0359502 A1  Dec. 8, 2016

Related U.S. Application Data

(60) Provisional application No. 62/170,599, filed on Jun. 3, 2015.

(51) Int. Cl.
*H03M 13/15* (2006.01)
*H03M 13/00* (2006.01)
*H03M 13/29* (2006.01)

(52) U.S. Cl.
CPC ..... *H03M 13/152* (2013.01); *H03M 13/1525* (2013.01); *H03M 13/1545* (2013.01); *H03M 13/1575* (2013.01); *H03M 13/6502* (2013.01); *H03M 13/2963* (2013.01)

(58) Field of Classification Search
CPC .................................................. H03M 13/151
USPC .......................... 714/785, 751, 755, 762, 781
See application file for complete search history.

(56) References Cited

U.S. PATENT DOCUMENTS

| | | | |
|---|---|---|---|
| 4,099,160 A | 7/1978 | Flagg | |
| 5,754,563 A * | 5/1998 | White | H03M 13/151 708/492 |
| 5,942,005 A * | 8/1999 | Hassner | G11B 20/1833 714/784 |
| 6,119,262 A * | 9/2000 | Chang | H03M 13/158 341/94 |

(Continued)

FOREIGN PATENT DOCUMENTS

CN  1561005  12/2010

*Primary Examiner* — Fritz Alphonse
(74) *Attorney, Agent, or Firm* — IP & T Group LLP

(57) ABSTRACT

A decoder includes a syndrome generator for receiving a codeword and generating at least two syndromes based on the codeword, an error location polynomial generator for generating an error-location polynomial based on the syndromes, an error location determiner for determining at least one error location based on the error-location polynomial, and an error corrector for correcting the codeword based on the one error location. The error location polynomial generator includes a logic for receiving the syndromes and generating a combination of the syndromes as a combination of coefficients of the error-location polynomial, and a key equation solver for generating the error-location polynomial based on the combination of the coefficients and finding at least one root of the error-location polynomial. The error location determiner determines the error location based on a combination of the root and one of the syndromes.

20 Claims, 3 Drawing Sheets

(56) References Cited

U.S. PATENT DOCUMENTS 8,601,351 B2 12/2013 Wong et al.
2014/0129899 A1 5/2014 Kumar et al.

* cited by examiner

ONE-SHOT DECODER FOR TWO-ERROR-CORRECTING BCH CODES

CROSS-REFERENCE TO RELATED APPLICATIONS

This application claims the benefit of U.S. Provisional Application No. 62/170,599 filed Jun. 3, 2015, the entire contents of which are herein incorporated by reference.

BACKGROUND

1. Field

Exemplary embodiments of the present disclosure relate to a decoder.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Since they have no moving parts, data storage devices using memory devices provide excellent stability, durability, high information access speed, and low power consumption. Examples of data storage devices having such advantages include universal serial bus (USB) memory devices, memory cards having various interfaces, and solid state drives (SSD).

SUMMARY

Embodiments of the present disclosure are directed to a decoder for use in a memory system.

Aspects of the invention include a decoder. The decoder includes: a syndrome generator for receiving a codeword and generating at least two syndromes based on the codeword; an error location polynomial generator for generating an error-location polynomial based on the syndromes; an error location determiner for determining at least one error location based on the error-location polynomial; and an error corrector for correcting the codeword based on the one error location. The error location polynomial generator includes: a logic for receiving the syndromes and generating a combination of the syndromes as a combination of coefficients of the error-location polynomial; and a key equation solver for generating the error-location polynomial based on the combination of the coefficients and finding at least one root of the error-location polynomial. The error location determiner determines the error location based on a combination of the root and one of the syndromes.

Other aspects of the invention include a memory system including a memory device storing data, and a controller including a decoder for decoding the data read from the memory device. The decoder includes: a syndrome generator for receiving a codeword and generating at least two syndromes based on the codeword; an error location polynomial generator for generating an error-location polynomial based on the syndromes; an error location determiner for determining at least one error location based on the error-location polynomial; and an error corrector for correcting the codeword based on the one error location. The error location polynomial generator includes: a logic for receiving the syndromes and generating a combination of the syndromes as a combination of coefficients of the error-location polynomial; and a key equation solver for generating the error-location polynomial based on the combination of the coefficients and finding at least one root of the error-location polynomial. The error location determiner determines the error location based on a combination of the root and one of the syndromes.

DETAILED DESCRIPTION

Figure 1:
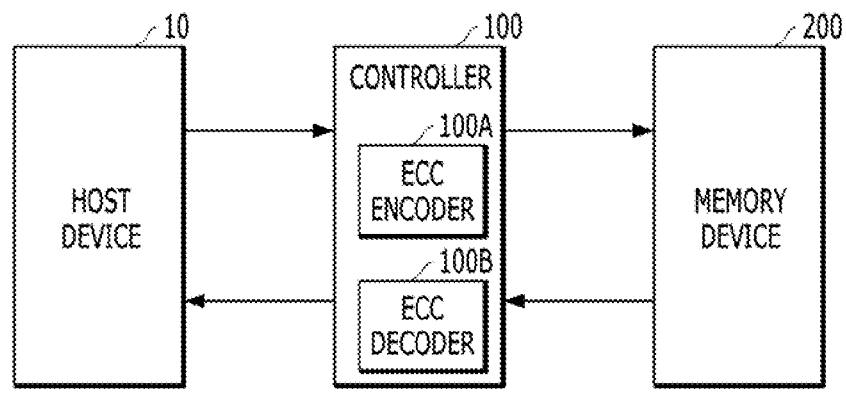
FIG. 1 is a diagram illustrating a memory system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram illustrating a data processing system including a memory system such as a data storage device.

Referring FIG. 1, the data processing system may include a host device 10, a controller 100 and a memory device 200. The controller 100 and the memory device 200 may form the memory system. The memory system may operate in response to a request for example, a write, read or erase request from a host device 10.

The host device 10 may be implemented using any one of various types of electronic devices. In some embodiments, the host device 10 may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device 10 may include a portable electronic device such as a mobile phone, a smart phone, an e-book, an MP3 player, a portable multimedia player (PMP), and a portable game player.

The memory controller 100 may control overall operations of the memory device 200. The memory device 200 may perform one or more erase, program, and read operations under the control of the controller 100.

The controller 100 and the memory device 200 may be integrated in a single semiconductor device. For example, the controller 100 and the memory device 200 may be integrated in a single semiconductor device such as a solid state drive (SSD). The solid state drive may include a storage device for storing data therein. When the memory system is used in an SSD, operation speed of a host (not shown) coupled to the memory system may remarkably improve.

The controller 100 and the memory device 200 may be integrated in a single semiconductor device such as a memory card. For example, the controller 100 and the memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

In another example, the memory system may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

The memory device 200 may store data accessed by the host device 10. The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device 10. The controller 100 may provide the data read from the memory device 200, to the host device 10, and store the data provided from the host device 10 into the memory device 200.

The controller 100 may include an error correction code (ECC) encoder 100A and an ECC decoder 100B as an ECC unit, which are bridging between the host device 10 and the memory device 200. The host device 10 sends data to be stored in the memory device 200. The data is encoded by the ECC encoder 100A and transferred to the memory device 200. When the data is required to be read, it is decoded by the ECC decoder 100B and then sent to the host device 10.

In some embodiments, the ECC encoder 100A and the ECC decoder 100B may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on.

In the memory system as described above, various technologies have been proposed for achieving higher storage density at a low cost. For example, multi-level cell (MLC)/tri-level cell (TLC) technology is proposed in memory systems such as NAND flash memories. However, these advantages come with damaging the reliability of the NAND flash memories. Codes such as the LDPC and BCH codes are most commonly applied for providing better data integrity.

A TPC code for the NAND flash memories can provide significant performance gains. In the TPC code, BCH codes are used as constituent codes for encoding data of multiple rows and columns. For decoding column and rows codes, a BCH decoder is used which utilizes maximum latency in a search procedure for example, a Chien search procedure. However, inevitable massive parallel architectures are required for throughput enhancement, resulting in significantly increased hardware complexity and power consumption.

Accordingly, in this disclosure, a technique is proposed which can solve this issue by avoiding Chien searches to directly find the roots of an error location polynomial in one cycle for two-error-correcting BCH codes. The proposed technique improves latency and throughput. Additionally, a key equation solver is combined in the proposed architecture for further reducing the area used on the silicon. The proposed architecture can be easily implemented on the hardware.

Figure 2:
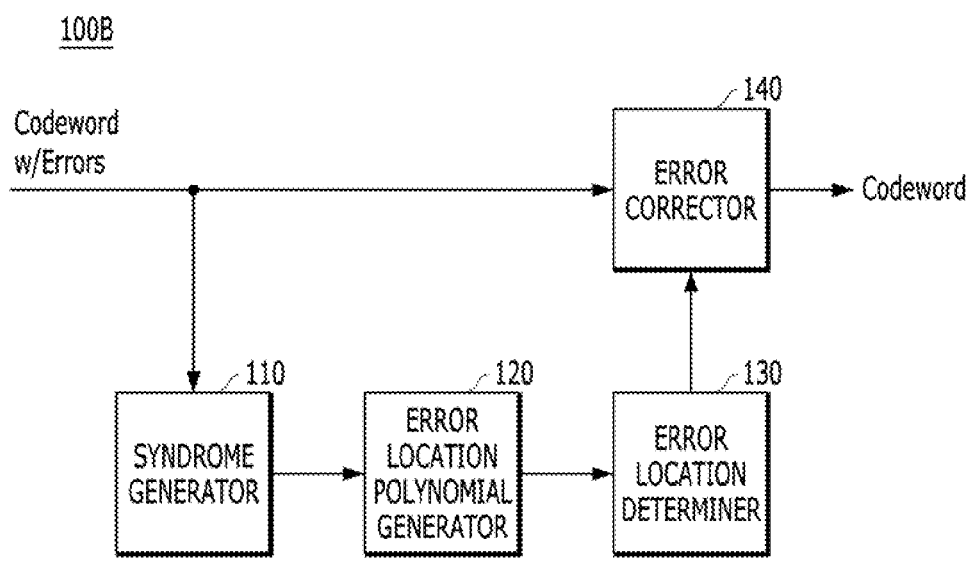
FIG. 2 is a diagram illustrating a decoder in accordance with embodiments of the present disclosure.

FIG. 2 is a diagram illustrating a decoder in accordance with embodiments of the present disclosure. For example, the decoder of FIG. 2 may be the ECC decoder 100B shown in FIG. 1.

Referring to FIG. 2, the decoder 100B may receive a codeword with errors, correct the errors and output a codeword without errors. To accomplish this error correction, the decoder 100B may include a syndrome generator 110, an error location polynomial generator 120, an error location determiner 130 and an error corrector 140.

The syndrome generator 110 may receive a codeword and generate at least two syndromes based on the codeword.

The error location polynomial generator 120 may generate an error-location polynomial based on the syndromes. In some embodiments, the error location polynomial generator 120 may include a logic for receiving the syndromes and generating a combination of the syndromes as a combination of coefficients of the error-location polynomial, and a key equation solver for generating the error-location polynomial based on the combination of the coefficients and finding at least one root of the error-location polynomial.

The error location determiner 130 may determine at least one error location based on the error-location polynomial.

The error corrector 140 may correct the codeword based on the one error location.

In general, a Berlekamp-Massey (BM) algorithm or an Extended Euclidean algorithm may be utilized to compute a key equation solver (KES) for BCH codes. However, in some embodiments using two-error-correcting BCH codes, it may be more efficient to apply a Peterson-Gorenstein-Zieler (PGZ) algorithm to calculate the coefficients of the error location polynomial $\Lambda(x)$:

$$\Lambda_0 = 1, \Lambda_1 = S_1, \Lambda_2 = \frac{S_3 + S_1^3}{S_1} \tag{1}$$

In the Equation (1), the inversion computation may be complicated. To simplify the hardware, the coefficients can be redefined in an inversionless manner:

$$\Lambda_0 = S_1, \Lambda_1 = S_1^2, \Lambda_2 = S_3 + S_1^3 \tag{2}$$

To make computation easier for the hardware, the error location polynomial may be transformed from $\Lambda_2 x^2 + \Lambda_1 x + \Lambda_0$ to:

$$y^2 + y + c, \text{ where } y = \frac{\Lambda_2}{\Lambda_1} x, c = \frac{\Lambda_2 \Lambda_0}{\Lambda_1^2} \tag{3}$$

By combining the methods mentioned above, the error locations can be calculated within one clock cycle after obtaining syndrome values.

Figure 3:
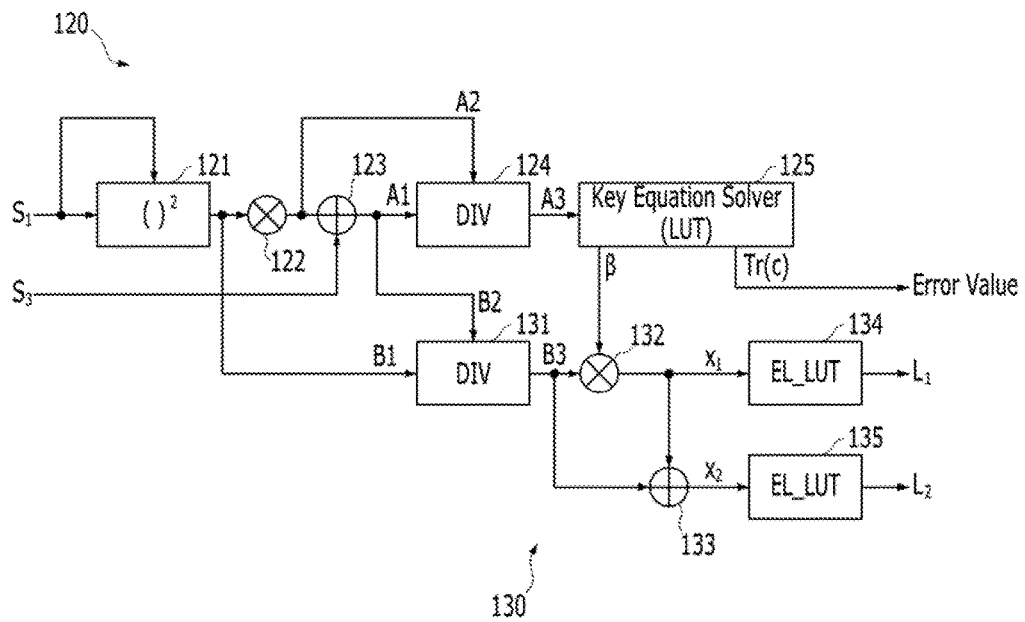
FIG. 3 is a diagram illustrating an error location polynomial generator and an error location determiner included in a decoder in accordance with a first embodiment of the present disclosure.

FIG. 3 is a diagram illustrating an error location polynomial generator and an error location determiner included in a decoder in accordance with a first embodiment of the present disclosure. For example, the construction of FIG. 3 may be the error location polynomial generator 120 and the error location determiner 130 of the ECC decoder 100B shown in FIG. 1. FIG. 3 shows the architecture of one-shot decoder for two errors case, where solving $y^2+y+c$ is a simple matrix computation.

Referring to FIG. 3, the error location polynomial generator 120 includes a logic for receiving syndromes S1, S3 and generating a combination of the syndromes as a combination of coefficients of the error-location polynomial.

The logic includes a square operator 121, a multiplier 122, an adder 123 and a divider 124. The square operator 121 squares a first syndrome $S_1$ of the syndromes as a first coefficient $\Lambda_0$ to output a second coefficient $\Lambda_1 (=S_1^2)$. The multiplier 122 multiplies the first coefficient $\Lambda_0$ by the second coefficient $\Lambda_1$ to output a multiplied result $\Lambda_0 \Lambda_1 (=S_1^3)$. The adder 123 adds the multiplied result and a second syndrome $S_3$ of the syndromes to output a third coefficient A1($\Lambda_2 = S_3 + S_1^3$). The divider 124 divides the third coefficient A1(=$\Lambda_2$) by the multiplied result A2(=$\Lambda_0 \Lambda_1$) to output the combination of coefficients A3(=$\Lambda_2 / \Lambda_0 \Lambda_1 = S_3 + S_1^3 / S_1^3$).

The key equation solver 125 generates the error-location polynomial based on the combination of the coefficients A3 and finds at least one root of the error-location polynomial. For example, the key equation solver 125 generates and solves the error-location polynomial $(y^2+y+c)$ for the combination of the coefficients A3. Further, the key equation solver 125 outputs a root β of the error-location polynomial and an error value of Tr(c), wherein Tr(c) indicates if there is a valid solution. The key equation solver 125 may be implemented with a look up table (LUT).

The logic further includes an additional divider 131 for dividing the second coefficient B1(=$\Lambda_1 = S_1^2$) by the third coefficient B2(=$\Lambda_2 = S_3 + S_1^3$) to output the dividing result B3(=$\Lambda_1 / \Lambda_2$).

The error location determiner 130 determines the error location based on a combination of the root β and one $S_1$ of the syndromes. The error location determiner 130 includes a multiplier 132, an adder 133, a lookup table 134 and a lookup table 135. The multiplier 132 multiplies the output B3 of the divider 131 by the root β to output a first root $x_1$. The adder 133 adds the output B3 of the divider 131 and the first root x1 to output a second root $x_2$. The lookup table EL_LUT 134 includes a plurality of error locations corresponding to a plurality of roots, and outputs a first error location value $L_1$ based on the first root $x_1$. The lookup table EL_LUT 135 includes a plurality of error locations corresponding to a plurality of roots, and outputs a second error location value $L_2$ based on the second root $x_2$.

A look up table EL_LUT is required to find the error location j based on the root $x=a^{-j}$. For a two-error-correcting BCH decoder, it also has to deal with one error case. A look up table EL_LUT' is applied to find the error location j based on the syndrome value $S_1=a^j$. Accordingly two different kinds LUT are needed in the decoder.

To share the LUT, we redefine the error location polynomial into $\Lambda'(x) = \Lambda_0 x^2 + \Lambda_1 x + \Lambda_2$ for two errors case. Therefore, the root becomes $x=a^j$.

Figure 4:
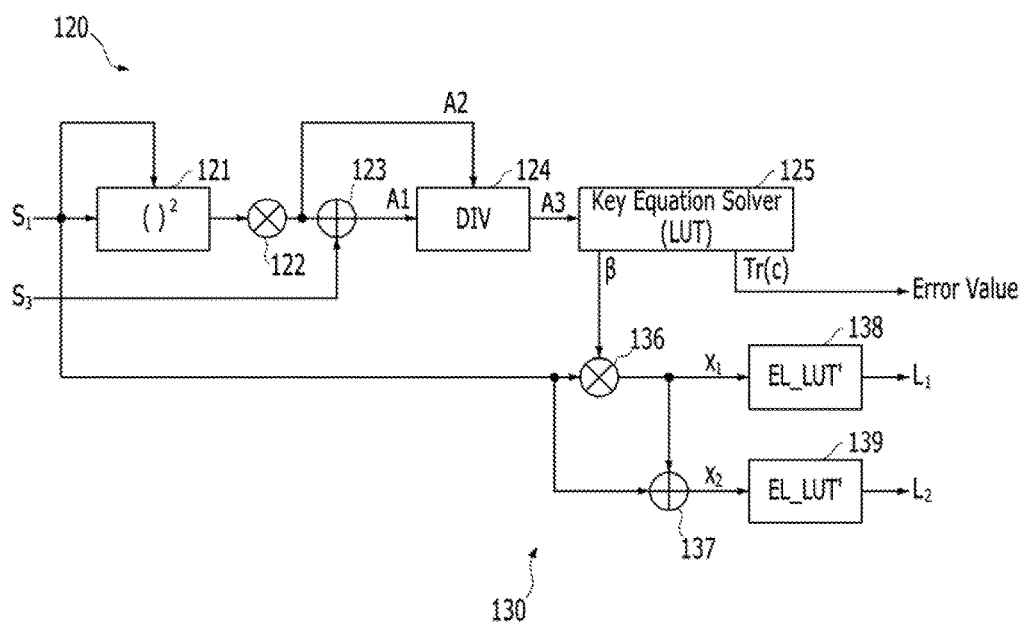
FIG. 4 is a diagram illustrating an error location polynomial generator and an error location determiner included in a decoder in accordance with a second embodiment of the present disclosure.

FIG. 4 is a diagram Illustrating an error location polynomial generator and an error location determiner included in a decoder in accordance with a second embodiment of the present disclosure. For example, the construction of FIG. 4 may be the error location polynomial generator 120 and the error location determiner 130 of the ECC decoder 100B shown in FIG. 1.

Referring to FIG. 4, the error location polynomial generator 120 includes a logic for receiving syndromes S1, S3 and generating a combination of the syndromes as a combination of coefficients of the error-location polynomial.

The logic includes a square operator 121, a multiplier 122, an Text adder 123 and a divider 124, as the same as the decoder in FIG. 3. The square operator 121 squares a first syndrome $S_1$ of the syndromes as a first coefficient $\Lambda_0$ to output a second coefficient $\Lambda_1(=S_1^2)$. The multiplier 122 multiplies the first coefficient $\Lambda_0$ by the second coefficient $\Lambda_1$ to output a multiplied result $\Lambda_0 \Lambda_1(=S_1^3)$. The adder 123 adds the multiplied result and a second syndrome $S_3$ of the syndromes to output a third coefficient $A1(\Lambda_2=S_3+S_1^3)$. The divider 124 divides the third coefficient $A1(=\Lambda_2)$ by the multiplied result $A2(=\Lambda_0\Lambda_1)$ to output the combination of coefficients $A3(=\Lambda_2/\Lambda_0\Lambda_1=S_3+S_1^3/S_1^3)$.

The key equation solver 125 generates the error-location polynomial based on the combination of the coefficients A3 and finds at least one root of the error-location polynomial. For example, the key equation solver 125 generates and solves the error-location polynomial $(y^2+y+c)$ for the combination of the coefficients A3. Further, the key equation solver 125 outputs a root β of the error-location polynomial and an error value of Tr(c). The key equation solver 125 may be implemented with a look up table (LUT).

The error location determiner 130 determines the error location based on a combination of the root β and one $S_1$ of the syndromes. The error location determiner 130 includes a multiplier 136, an adder 137, a lookup table EL_LUT' 138 and a lookup table EL_LUT' 139. The multiplier 136 multiplies the first syndrome $S_1$ by the root β to output a first root $x_1$. The adder 137 adds the first syndrome $S_1$ and the first root x1 to output a second root $x_2$. The lookup table EL_LUT' 138 includes a plurality of error locations corresponding to a plurality of roots, and outputs a first error location value $L_1$ based on the first root $x_1$. The lookup table EL_LUT' 139 includes a plurality of error locations corresponding to a plurality of roots, and outputs a second error location value $L_2$ based on the second root $x_2$.

As compared to FIG. 3, in the decoder of FIG. 4, a look up table EL_LUT' is utilized and the number of dividers is reduced to one. Furthermore, the error locations still can be obtained within one clock cycle.

Figure 5:
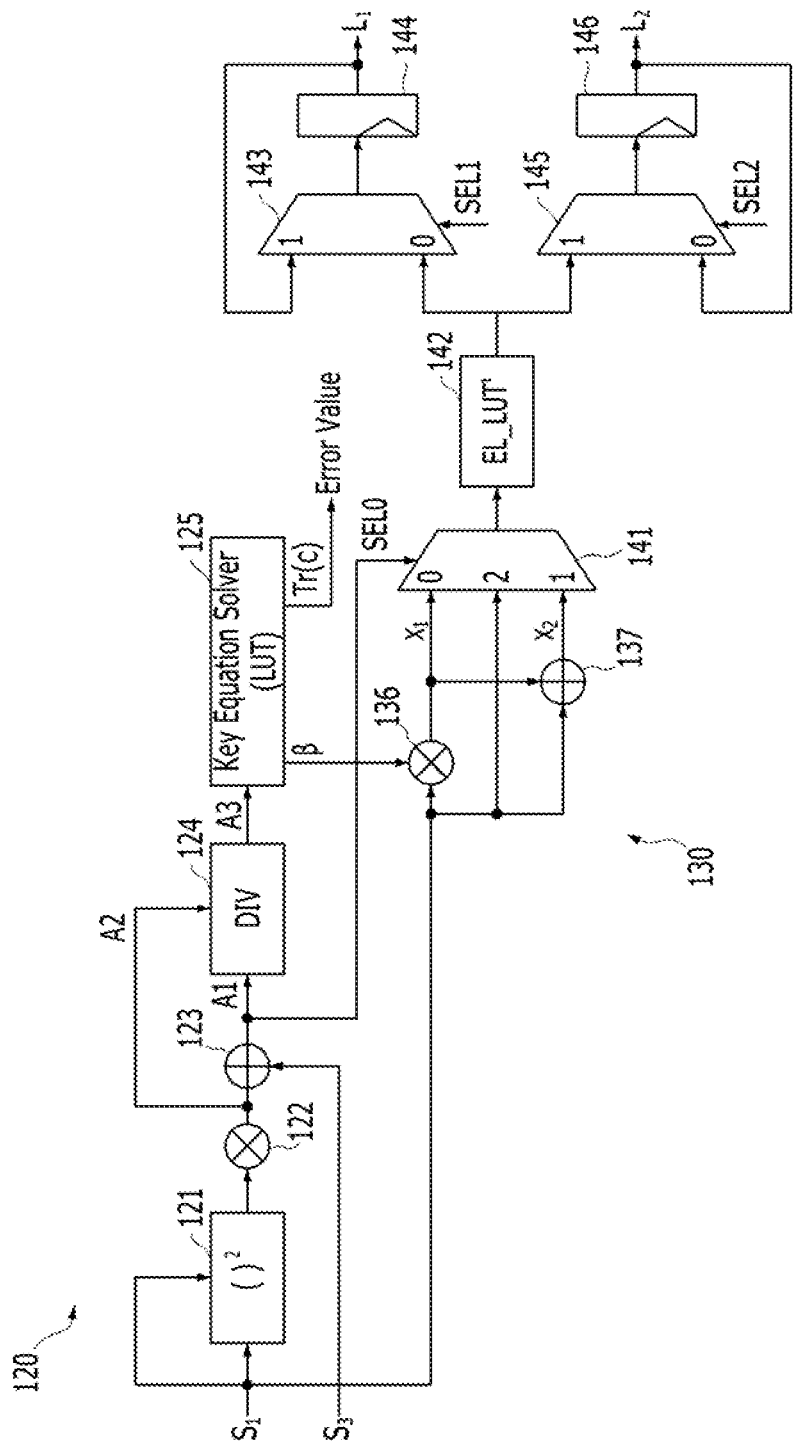
FIG. 5 is a diagram illustrating an error location polynomial generator and an error location determiner included in a decoder in accordance with a third embodiment of the present disclosure.

FIG. 5 is a diagram illustrating an error location polynomial generator and an error location determiner included in a decoder in accordance with a third embodiment of the present disclosure. For example, the construction of FIG. 5 may be the error location polynomial generator 120 and the error location determiner 130 of the ECC decoder 100B shown in FIG. 1. To further optimize the hardware and support both one error and two errors cases, only one look up table EL_LUT' is required if two clock cycles are taken to calculate error locations.

Referring to FIG. 5, the error location polynomial generator 120 includes a logic for receiving syndromes S1, S3 and generating a combination of the syndromes as a combination of coefficients of the error-location polynomial.

The logic includes a square operator 121, a multiplier 122, an adder 123 and a divider 124, which is the same as the decoder in FIG. 3. The square operator 121 squares a first syndrome $S_1$ of the syndromes as a first coefficient $\Lambda_0$ to output a second coefficient $\Lambda_1(=S_1^2)$. The multiplier 122 multiplies the first coefficient $\Lambda_0$ by the second coefficient $\Lambda_1$ to output a multiplied result $\Lambda_0\Lambda_1(=S_1^3)$. The adder 123 adds the multiplied result and a second syndrome $S_3$ of the syndromes to output a third coefficient $A1(\Lambda_2=S_3+S_1^3)$. The divider 124 divides the third coefficient $A1(=\Lambda_2)$ by the multiplied result $A2(=\Lambda_0\Lambda_1)$ to output the combination of coefficients $A3(=\Lambda_2/\Lambda_0\Lambda_1=S_3+S_1^3/S_1^3)$.

The key equation solver 125 generates the error-location polynomial based on the combination of the coefficients A3 and finds at least one root of the error-location polynomial. For example, the key equation solver 125 generates and solves the error-location polynomial $(\Lambda'(x)=\Lambda_0 x^2+\Lambda_1 x+\Lambda_2)$ for the combination of the coefficients A3. Further, the key equation solver 125 outputs a root β of the error-location polynomial and an error value of Tr(c). The key equation solver 125 may be implemented with a look up table (LUT).

The error location determiner 130 determines the error location based on a combination of the root β and one $S_1$ of the syndromes. The error location determiner 130 includes a multiplier 136, an adder 137, a multiplexer 141, a lookup table 142, a multiplexer 143, a flip-flop 144, a multiplexer 145, and a flip-flop 146. The multiplier 136 multiplies the first syndrome S1 by the root β to output a first root $x_1$. The adder 137 adds the first syndrome $S_1$ and the first root $x_1$ to output a second root $x_2$.

The lookup table EL_LUT' 142 includes a plurality of error locations corresponding to a plurality of roots, and outputs an error location value based on one of the first root $x_1$ and the second root $x_2$.

The multiplexer 141 includes 3 input terminals and one output terminal. The multiplexer 141 receives the first root $x_1$, the second root $x_2$ and the first syndrome $S_1$, and outputs one of the first root $x_1$, the second root $x_2$ and the first syndrome $S_1$ according to a selection signal SEL0 to the lookup table 142. The selection signal SEL0 includes the third coefficient $A1(=\Lambda_2)$.

The multiplexer 143 receives the error location value from the lookup table 142 and the output of the flip-flop 144, and outputs to the flip-flop 144 one of the error location value and the output of the flip-flop 144 according to a selection signal SEL1 as the first error location value $L_1$.

The multiplexer 145 receives the error location value from the lookup table 142 and the output of the flip-flop 146, and outputs to the flip-flop 146 one of the error location value and the output of the flip-flop 146 according to a selection signal SEL2 as the second error location value $L_2$.

The architecture of revised one-shot decoder is shown in FIG. 5. In summary, the proposal provides a simple yet novel architecture to find error locations in 2 (or 1) clock cycle. The proposed architecture improves latency and throughput while utilizing a reduced area on the silicon.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of operating a memory system comprising:
receiving requests from a host device;
receiving a codeword and generating at least two syndromes based on the codeword;
generating an error-location polynomial based on the syndromes, wherein the generation of the error-location polynomial includes receiving the syndromes, generating a combination of the syndromes as a combination of coefficients of the error-location polynomial, generating the error-location polynomial based on the combination of the coefficients, and finding at least one root of the error-location polynomial;
determining at least one error location based on the error-location polynomial, wherein the error location is based on a combination of the root and one of the syndromes; and
correcting the codeword based on the at least the one error location.

2. The method of claim 1, wherein the generating error-location polynomial includes:
squaring a first syndrome of the syndromes as a first coefficient to output a second coefficient;
multiplying the first coefficient by the second coefficient to output a multiplied result;

adding the multiplied result and a second syndrome of the syndromes to output a third coefficient; and dividing the third coefficient by the multiplied result to output the combination of coefficients.

3. The method of claim 2, wherein the generating the error-location polynomial includes:

dividing the second coefficient by the third coefficient.

4. The method of claim 3, wherein the determining at least one error location includes:

multiplying the output of the additional divider by the root to output a first root;

adding the output of the additional divider and the first root to output a second root;

based on a first lookup table including a plurality of error locations corresponding to a plurality of roots, outputting a first error location value based on the first root; and based on a second lookup table including a plurality of error locations corresponding to a plurality of roots, outputting a second error location value based on the second root.

5. The method of claim 2, wherein the determining at least one error location includes:

multiplying a first syndrome of the syndromes by the root to output a first root;

adding the first syndrome and the first root to output a second root;

based on a first lookup table including a plurality of error locations corresponding to a plurality of roots, outputting a first error location value based on the first root; and based on a second lookup table including a plurality of error locations corresponding to a plurality of roots, outputting a second error location value based on the second root.

6. The method of claim 2, wherein the determining at least one error location includes:

multiplying a first syndrome of the syndromes by the root to output a first root;

adding the first syndrome and the first root to output a second root; and based on a lookup table including a plurality of error locations corresponding to a plurality of roots, outputting an error location value based on one of the first root and the second root.

7. The method of claim 6, further comprising:

receiving the first root and the second root and outputting one of the first root and the second root according to a selection signal to the lookup table.

8. The method of claim 7, wherein the selection signal includes the third coefficient.

9. The method of claim 7, further comprising:

receiving the first syndrome.

10. The method of claim 6, further comprising:

outputting a first error location value based on the first root by a first flip-flop;

receiving the error location value from the lookup table and the output of the first flip-flop, and outputting to the first flip-flop one of the error location value and the output of the first flip-flop according to a selection signal as the first error location value;

outputting a second error location value based on the second root by a second flip-flop; and a second multiplexer for receiving the error location value from the lookup table and the output of the second flip-flop, and outputting to the second flip-flop one of the error location value and the output of the second flip-flop according to the selection signal as the second error location value.

11. A memory system comprising a host device configured to send requests;

a memory device including groups of memory cells, and configured to store data in accordance with the requests from the host device; and a controller coupled with the host device and the memory device, and including a decoder configured to decode the data read from the memory device, wherein the decoder comprises:

a syndrome generator receives a codeword of the data and generate at least two syndromes based on the codeword;

an error location polynomial generator generates an error-location polynomial based on the syndromes, wherein the error location polynomial generator includes:

a logic receives the syndromes and generates a combination of the syndromes as a combination of coefficients of the error-location polynomial; and a key equation solver generates the error-location polynomial based on the combination of the coefficients and finds at least one root of the error-location polynomial;

an error location determiner determines at least one error location based on the error-location polynomial, wherein the error location determiner determines the error location based on at least a combination of the root and one of the syndromes; and an error corrector corrects the codeword based on the at least one error location.

12. The memory system of claim 11, wherein the logic includes:

a square operator for squaring a first syndrome of the syndromes as a first coefficient to output a second coefficient;

a multiplier for multiplying the first coefficient by the second coefficient to output a multiplied result;

an adder for adding the multiplied result and a second syndrome of the syndromes to output a third coefficient; and a divider for dividing the third coefficient by the multiplied result to output the combination of coefficients.

13. The memory system of claim 12, wherein the logic further includes:

an additional divider for dividing the second coefficient by the third coefficient.

14. The memory system of claim 13, wherein the error location determiner includes:

a multiplier for multiplying the output of the additional divider by the root to output a first root;

an adder for adding the output of the additional divider and the first root to output a second root;

a first lookup table including a plurality of error locations corresponding to a plurality of roots, for outputting a first error location value based on the first root; and a second lookup table including a plurality of error locations corresponding to a plurality of roots, for outputting a second error location value based on the second root.

15. The memory system of claim 12, wherein the error location determiner includes:

a multiplier for multiplying a first syndrome of the syndromes by the root to output a first root;

an adder for adding the first syndrome and the first root to output a second root;

a first lookup table including a plurality of error locations corresponding to a plurality of roots, for outputting a first error location value based on the first root; and a second lookup table including a plurality of error locations corresponding to a plurality of roots, for outputting a second error location value based on the second root.

16. The memory system of claim 12, wherein the error location determiner includes:
a multiplier for multiplying a first syndrome of the syndromes by the root to output a first root;
an adder for adding the first syndrome and the first root to output a second root; and
a lookup table including a plurality of error locations corresponding to a plurality of roots, for outputting an error location value based on one of the first root and the second root.

17. The memory system of claim 16, further comprising:
a multiplexer for receiving the first root and the second root, and outputting one of the first root and the second root according to a selection signal to the lookup table.

18. The memory system of claim 17, wherein the selection signal includes the third coefficient.

19. The memory system of claim 17, wherein the multiplexer further receives the first syndrome.

20. The memory system of claim 16, further comprising:
a first flip-flop for outputting a first error location value based on the first root;
a first multiplexer for receiving the error location value from the lookup table and the output of the first flip-flop, and outputting to the first flip-flop one of the error location value and the output of the first flip-flop according to a selection signal as the first error location value;
a second flip-flop for outputting a second error location value based on the second root; and
a second multiplexer for receiving the error location value from the lookup table and the output of the second flip-flop, and outputting to the second flip-flop one of the error location value and the output of the second flip-flop according to the selection signal as the second error location value.

* * * * *